United States Patent
Iyer et al.

(10) Patent No.: US 10,627,465 B2
(45) Date of Patent: Apr. 21, 2020

(54) MRI METAMATERIAL LINER

(71) Applicants: The Governors of the University of Alberta, Edmonton (CA); Alberta Health Services, Edmonton (CA)

(72) Inventors: Ashwin K. Iyer, Edmonton (CA); Justin G. Pollock, Edmonton (CA); Nicola de Zanche, Edmonton (CA)

(73) Assignees: The Governors of the University of Alberta, Edmonton, Alberta (CA); Alberta Health Services, Edmonton, Alberta (CA)

( * ) Notice: Subject to any disclaimer, the term of this patent is extended or adjusted under 35 U.S.C. 154(b) by 5 days.

(21) Appl. No.: 15/952,130

(22) Filed: Apr. 12, 2018

(65) Prior Publication Data

US 2019/0317163 A1 Oct. 17, 2019

(51) Int. Cl.
*G01R 33/422* (2006.01)
*G01R 33/48* (2006.01)

(52) U.S. Cl.
CPC ....... *G01R 33/422* (2013.01); *G01R 33/4802* (2013.01)

(58) Field of Classification Search
CPC .................................................. G01R 33/422
USPC ................................................. 324/318, 322
See application file for complete search history.

(56) References Cited

U.S. PATENT DOCUMENTS

| | | | |
|---|---|---|---|
| 9,529,062 B2 * | 12/2016 | Iyer ................... | G01R 33/4802 |
| 2011/0204891 A1 * | 8/2011 | Drake .................. | G01N 24/084 |
| | | | 324/309 |
| 2013/0200897 A1 | 8/2013 | Ashwin et al. | |
| 2016/0018491 A1 * | 1/2016 | Driscoll ............. | G01R 33/3614 |
| | | | 324/309 |

OTHER PUBLICATIONS

Shchelokova et al., Tunable hybrid metasurfaces for MRI applications, AIP Conference Proceedings 1874, 030033, 2017 (Year: 2017).*
Schmidt et al., Flexible and compact hybrid metasurfaces for enhanced ultra-high field in vivo magnetic resonance imaging, Scientific Reports, 7: 1678, 2017 (Year: 2017).*
Justin G. Pollock et al. Traveling-Wave MRI at Lower B0 Field Strenghts Using Metamaterials Liners; Proc. Intl. Soc. Mag. Med. 20 (2012); p. 2792.

(Continued)

*Primary Examiner* — Daniel R Miller
(74) *Attorney, Agent, or Firm* — Anthony R. Lambert

(57) ABSTRACT

A metamaterial liner for an MRI bore. The metamaterial liner may cover only a portion of the MRI bore, allowing travelling wave excitations within the lined portion. By restricting the waves to the lined portion, improved signal to noise ratio may be provided. The lined length may be adjustable, for example by forming the metamaterial liner of removable annular segments. A method is provided of adjusting the length of the lined portion by removing metamaterial segments. The segments may be included in interchangeable modules. The MRI liner is suitable for any magnetic field strength, and in particular may provide improved signal to noise at reduced technical difficulty at magnetic field strengths between conventional field strengths suitable for a birdcage coil and conventional travelling wave field strengths.

23 Claims, 6 Drawing Sheets

(56) References Cited

OTHER PUBLICATIONS

Justin G. Pollock and Ashwin K. Iyer: Experimental Verification of Below-Cutoff Propagation in Miniaturized Circular Waveguides Using Anisotropic ENNZ Metamaterial Liners; IEEE Transactions on Microwave Theory and Techniques, vol. 64; No. 4; Apr. 2016; p. 1297-1305.

Justin G. Pollock and Ashwin K Iyer: Miniaturized Circular Waveguide Probe Antennas Using ENNZ Metamaterial Liners; IEEE APS/URSI 2014; Jul. 8-14, 2014; p. 1-20.

Justin G. Pollock and Ashwin K. Iyer: Miniaturized Circular-Waveguide Probe Antennas Using Metamaterial Liners; IEEE Transactions on Antennas and Propagation, vol. 63, No. 1; Jan. 2015; p. 428-433.

Justin G. Pollock and Ashwin K. Iyer: Radiation Characteristics of Miniaturized Metamaterial-Lined Waveguid Probe Antennas; APSURI 2015; p. 1-2.

Downloaded from www.researchgate.net/publication/242545239: Travelling-Wave NMR and MRI; articles uploaded on May 30; 2014; p. 1-29.

\* cited by examiner

MRI METAMATERIAL LINER

TECHNICAL FIELD

Metamaterial Liners for Magnetic Resonance Imaging.

BACKGROUND

MRI scanners use a strong, uniform static magnetic field, conventionally denoted $B_0$, to cause protons (hydrogen nuclei) to be subject to a resonance at a particular radio frequency (RF), known as the Larmor frequency, which depends on the field strength: $f_0=\gamma B_0$, $\gamma=42.6$ MHz/T. In that formula $f_0$ is the Larmor frequency and $B_0$ is the static magnetic field, with $\gamma$ being a proportionality factor (gyromagnetic ratio). Near-field coils are used to excite protons at the Larmor frequency and to detect a signal from the oscillating protons. The main static field is typically aligned with the length of the scanner's bore. The RF excitations applied to excite the protons include a magnetic field conventionally denoted $B_1$, typically transverse to the main static magnetic field and circularly polarized. The excitations typically have a bandwidth less than 100 kHz. These excitations at the Larmor frequency cause the spins of the protons, which initially are on average aligned with the main static field, to change orientation so that the spins on average point in a different direction. The spins precess about the main static field, causing the average orientation of the spins to also precess, producing a detectable signal. Typically, to encode position information in the signal to construct an image, gradient fields are applied that change the strength of the main static magnetic field depending on position. The RF excitations are typically applied in pulses of duration in the range of 100 µs-3 ms and with a repetition rate in the range of 5 ms to several seconds. Preferably, the amplitude of the excitations is uniform to achieve uniform image intensity and contrast, and high sensitivity (high B1magnetic field per unit voltage excitation or power). For safety reasons, there are local and whole body specific absorption rate (SAR) constraints (IEC 60601-2-33).

Due to difficulties in producing a strong uniform magnetic field over a large volume, MRI scanners typically have narrow bores, which can lead to claustrophobia in patients. At the typical magnetic field strengths, the Larmor frequency for protons is sufficiently low and the bore sufficiently narrow that electromagnetic waves at the Larmor frequency cannot propagate through the bore. To produce the excitations, antennas known as a body coil or "birdcage" coil are provided within the bore. The birdcage coil 30 (an example shown in FIG. 1) is a resonant ladder network excited in CP (quadrature) mode. "Rungs" 32 each have a capacitor 34 to cause resonance. The static magnetic field $B_0$ is indicated by arrow 36. Electrical connections to drive the birdcage coil are not shown. An array of separate receiving coils/loops (not shown) is used for maximum signal-to-noise ratio (SNR) in reception. The birdcage coil can also be used to receive, but the SNR will be low. The birdcage coil typically takes up significant space in the bore, increasing claustrophobia. Simply extending the birdcage too close to a conductive bore to reduce claustrophobia would create image currents on the bore, reducing efficiency. In FIG. 2, 40 shows an example magnetic field (uniform birdcage mode) represented by field lines 38, the magnetic field represented being the magnetic field $B_1$ induced in the space within a conductive bore 40 at a point in time by a birdcage coil 30 within the bore.

Traditional body coils do not require typically subject-specific adjustments at lower $B_0$ field strengths, but at high frequency they are highly sensitive to dielectric loading. These higher $B_0$ fields and Larmor frequencies can be useful to improve signal- and contrast-to-noise ratios, allowing higher resolution. Body coils are also costly to build because they contain expensive components like high-voltage capacitors, and the use of a small number of localized elements requires tuning and balancing on the bench for optimal operation. Simply increasing the number of rungs to distribute the capacitance would increase the number of paths, and lead to a cluttered mode spectrum.

Travelling wave (TW) MRI has been one proposal to deal with the claustrophobia issue. Like a waveguide, the TW MRI bore has a cutoff frequency for propagating waves, and because of the size of bore required to accommodate the body of the patient, this cutoff frequency is in the order of several hundred MHz. For example, a typical MRI bore may be 58 cm in diameter and have a natural frequency cutoff of the TE11 mode of approximately 300 MHz. This natural cutoff frequency of the MRI bore prevents waves having a frequency below the natural cutoff frequency from propagating through the MRI bore. In a typical travelling wave MRI, a stronger magnetic field is used to increase the Larmor frequency for protons to above the cutoff for the bore. Antennas are then placed outside the bore to produce and detect excitations that can propagate through the bore. However, travelling wave MRI has developed a reputation for a lower image SNR than conventional MRI.

U.S. Pat. No. 9,529,062 describes a metamaterial liner for MRI for lowering a cutoff frequency of the MRI bore for use in travelling-wave magnetic resonance imaging. Metamaterials are periodic structures that can provide effective bulk permeability and permittivity responses beyond those found in nature. The lowering of the cutoff frequency allows travelling-wave MRI to be used in an MRI scanner with conventional field strength, so that a conventional MRI scanner can be retrofitted as a travelling-wave MRI scanner.

A metamaterial for lowering the cutoff frequency of a bore, using radial inductors and circumferential capacitors, was disclosed in Justin Pollock and Ashwin K. Iyer, "Experimental Verification of Below-Cutoff Propagation in Miniaturized Circular Waveguides Using Anisotropic ENNZ Metamaterial Liners", IEEE Transactions On Microwave Theory and Techniques, vol. 64, no. 4, 2016.

The phrase "lowering the cutoff frequency" is used to mean that a new passband is introduced by the metamaterial liner in the otherwise below-cutoff frequency region. This passband is different than that above cutoff in an empty circular waveguide. The passband introduced by the metamaterial has a cutoff frequency below which propagation is permitted.

SUMMARY

There is provided a liner for a bore of an MRI scanner, the liner having an annular shape and being formed of a metamaterial having a relative electrical permittivity that is negative and near zero at a working frequency of the MRI scanner corresponding to a Larmor frequency in a magnetic field of the MRI scanner. The liner may extend less than a full length of the bore.

In various embodiments, there may be included any one or more of the following features: the liner may extend through an intermediate portion of the bore between two ends of the bore and not extend to either of the two ends. The static magnetic field of the MRI scanner may have any strength, but particularly including a strength of greater than 1.5 Tesla or greater than 3 Tesla and less than 7 Tesla. The static magnetic field of the MRI scanner may also have a strength of less than 0.5 Tesla. The liner may be formed as a cylindrical arrangement of a 2D metamaterial. The metamaterial may comprise plural annular metamaterial segments. Each annular metamaterial segment may have an inner circumferential conductor and an outer circumferential conductor, capacitors on at least one of the inner and outer conductors, and inductors connecting the inner and outer conductors. Each annular metamaterial segment may be configured to be removable from the bore. Each annular metamaterial segment may be part of a metamaterial module, the respective metamaterial modules being sized and shaped to be interchangeable. The metamaterial modules may be configured to connect to adjacent metamaterial modules. Each metamaterial module may comprise an additional bore segment, the additional bore segments forming an additional bore within the scanner bore when the modules are in place within the bore. Additional modules sized and shaped to be interchangeable with the metamaterial modules may be placed within the bore to provide further additional bore segments to cause the additional bore to extend the full length of the scanner bore. Electromagnetic excitations may be produced at the working frequency by an antenna located within the bore adjacent to the liner and connected to a feed line. The antenna may be in an antenna module, the antenna module being sized and shaped to be interchangeable with metamaterial modules. Electromagnetic excitations may be produced at the working frequency by a metamaterial segment connected to a feed line. Any feed line may be multiple feed lines. Where there is an additional bore, the feed line may extend through a gap between the additional bore and the scanner bore. The feed line may comprise coaxial cable having a sheath grounded to the bore. The sheath may be removably grounded to the bore.

There is also provided a liner for a bore of an MRI scanner having a static magnetic field strength of less than 7 Tesla and greater than 1.5 Tesla, the liner having an annular shape and being formed of a metamaterial having a relative electrical permittivity that is negative and near zero at a working frequency of the MRI scanner corresponding to a Larmor frequency in the magnetic field of the MRI scanner.

In various embodiments, there may be included any one or more of the following features: the static magnetic field may be greater than 3 Tesla and less than 7 Tesla. The liner may be formed as a cylindrical arrangement of a 2D metamaterial. The metamaterial may comprise plural annular metamaterial segments. Each annular metamaterial segment may have an inner circumferential conductor and an outer circumferential conductor, capacitors on at least one of the inner and outer conductors, and inductors connecting the inner and outer conductors. Each annular metamaterial segment may be configured to be removable from the bore. Electromagnetic excitations may be produced at the working frequency by an antenna located adjacent to the bore or within the bore adjacent to the liner. A metamaterial segment may be electrically connected to a power source to produce the electromagnetic excitations at the working frequency.

There is also provided a method of magnetic resonance imaging. The method includes supplying an MRI scanner having a scanner bore, positioning a first number of annular metamaterial segments within the bore, to form a metamaterial liner extending a first length within the scanner bore and having a relative electrical permittivity that is negative and near zero at a working frequency of the MRI scanner corresponding to a Larmor frequency in the magnetic field of the MRI scanner, producing first excitations within the first length of the scanner bore, detecting first NMR signals resulting from the first excitations within the first length of the scanner bore to produce a first image, removing one or more of the annular metamaterial segments from the scanner bore to reduce the metamaterial liner to a second length within the scanner bore smaller than the first length, producing second excitations within the second length of the scanner bore, and detecting second NMR signals resulting from the second excitations within the second length of the bore to produce a second image.

In various embodiments, there may be included any one or more of the following features: Each of the metamaterial segments may be part of a metamaterial module, the respective metamaterial modules being sized and shaped to be interchangeable. The metamaterial modules may be configured to connect to adjacent metamaterial modules. Each metamaterial module may comprise an additional bore segment, the additional bore segments forming an additional bore within the scanner bore when the modules are in place within the bore. Additional modules sized and shaped to be interchangeable with the metamaterial modules may be placed within the bore to provide further additional bore segments to cause the additional bore to extend a full length of the scanner bore. The first excitations may be produced by an antenna within the scanner bore and connected to a feed line. The antenna may be in an antenna module, the antenna module being sized and shaped to be interchangeable with the metamaterial modules. The first excitations may be produced by a metamaterial segment connected to a feed line. Any feed line may be multiple feed lines. Where there is an additional bore, the feed line may extend through a gap between the additional bore and the scanner bore. The feed line may comprise coaxial cable having a sheath grounded to the bore. The sheath may be removably grounded to the bore.

These and other aspects of the device and method are set out in the claims.

BRIEF DESCRIPTION OF THE FIGURES

Embodiments will now be described with reference to the figures, in which like reference characters denote like elements, by way of example, and in which.

DETAILED DESCRIPTION

Figure 1:
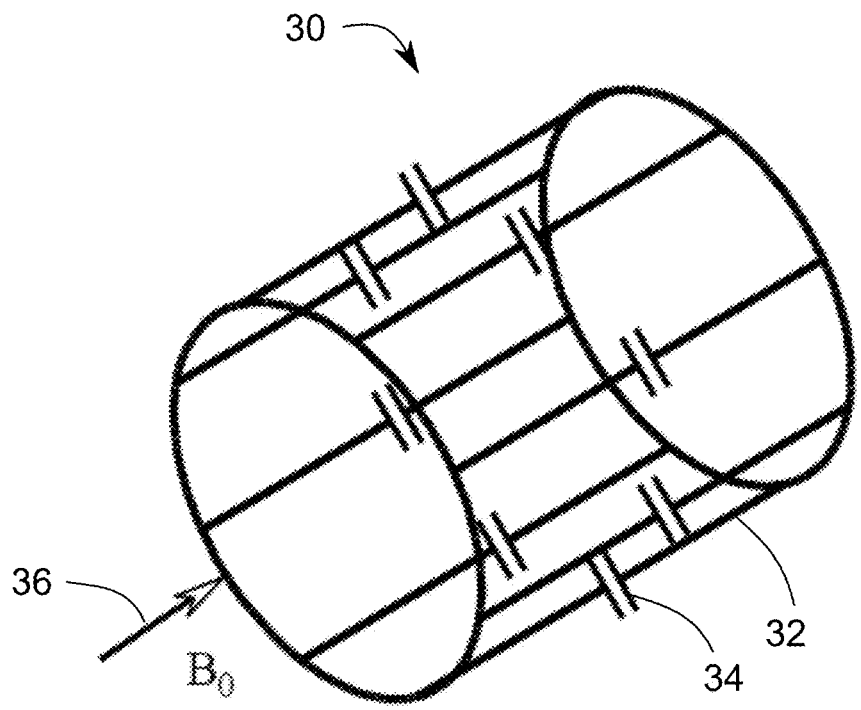
FIG. 1 is a schematic isometric view of a prior art birdcage coil.
Figure 2:
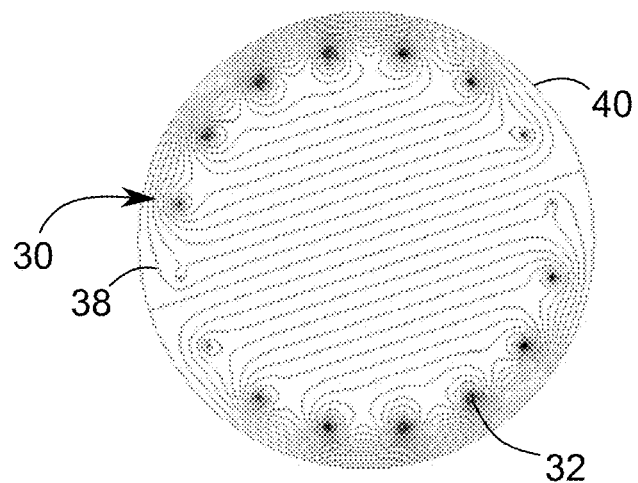
FIG. 2 is a schematic cross section showing a magnetic field produced by a prior art birdcage coil.

Immaterial modifications may be made to the embodiments described here without departing from what is covered by the claims.

A metamaterial liner is provided for a MRI scanner. As compared to a birdcage coil, a metamaterial has a larger number of lumped elements, distributing elements at extremely sub-wavelength intervals. Each distributed circuit element can have a smaller effect on the overall characteristics of the metamaterial than an element of a birdcage coil, allowing the use of less precise, cheaper elements (although more total elements are required).

A metamaterial lining of a conductive bore may be formed as a cylindrical version of a 2D metamaterial. The metamaterial may be formed using a Transmission Line (TL) model. Although the metamaterial does not eliminate image currents on a conductive bore which the metamaterial lines, the TL currents produced in the metamaterial and the image currents in the bore can be used to engineer the field distribution and modes supported in the bore volume.

Although a metamaterial may support an infinite number of modes, which of these are excited (the so-called "dominant" modes) may be restricted through proper choice of an excitation/antenna/source and by limiting the frequency range. Therefore, although the metamaterial may generally support multiple modes, careful design of the metamaterial, selection of the source, and restriction of the frequency range may allow the support of a single dominant mode. This can alleviate the multiple mode problem that can arise from increasing the number of rungs of a birdcage coil. It is also possible to exploit different modes occurring at the same frequency by encoding different streams of information into each. This is known as "RF shimming".

In order to generate a suitable excitation for MRI, it is desired that a relatively homogeneous transverse magnetic field be created. This relatively homogeneous transverse magnetic field is associated, in the interior of the bore, with a homogeneous transverse electric field, E. However, a conductive bore cannot have tangential electric fields at its surface; any electric fields must be normal to a conductive bore's surface. A thin liner may be constructed with an electrical permittivity selected to form a transition between the homogenous transverse electric field in the interior of the bore encircled by the liner and a radial electric field within the liner itself. For an annular liner we have $$\tan\theta_2 = \tan\theta_1 \frac{\varepsilon_2}{\varepsilon_1}$$

where $\theta_1$ is the angle between a radial direction and the electric field in the interior of the bore encircled by the liner, this interior portion having permittivity $\varepsilon_1$, and $\theta_2$ is the angle between the radial direction and the electric field within the liner itself, the liner having permittivity $\varepsilon_2$. If the interior is vacuum, $\varepsilon_1=1$, and for air or typical dielectrics $\varepsilon_1$ will be higher than but not many times higher than one. $\theta_1$ will depend on the circumferential position within the bore at any given time, varying between 90 degrees and zero degrees. Thus, to make the field within the liner nearly radial (i.e. $\theta_2$ consistently close to zero) we can use $\varepsilon_2$ near zero, i.e., an epsilon near zero (ENZ) metamaterial can be used. The liner fields will be very strong, but the bore fields weaker, at a proportionality of about $\varepsilon_1/\varepsilon_2$. The permittivity must also have a dispersion (variation with frequency) that is causal. It turns out that $\varepsilon_2$ must also be <0, so an Epsilon-Negative-Near-Zero (ENNZ) metamaterial may be used.

In general, the permittivity of a metamaterial is frequency-dependent. A metamaterial may be selected to have a negative and near zero permittivity at a working frequency of an MRI scanner, typically the Larmor frequency for a magnetic field strength of the MRI scanner.

Figure 3:
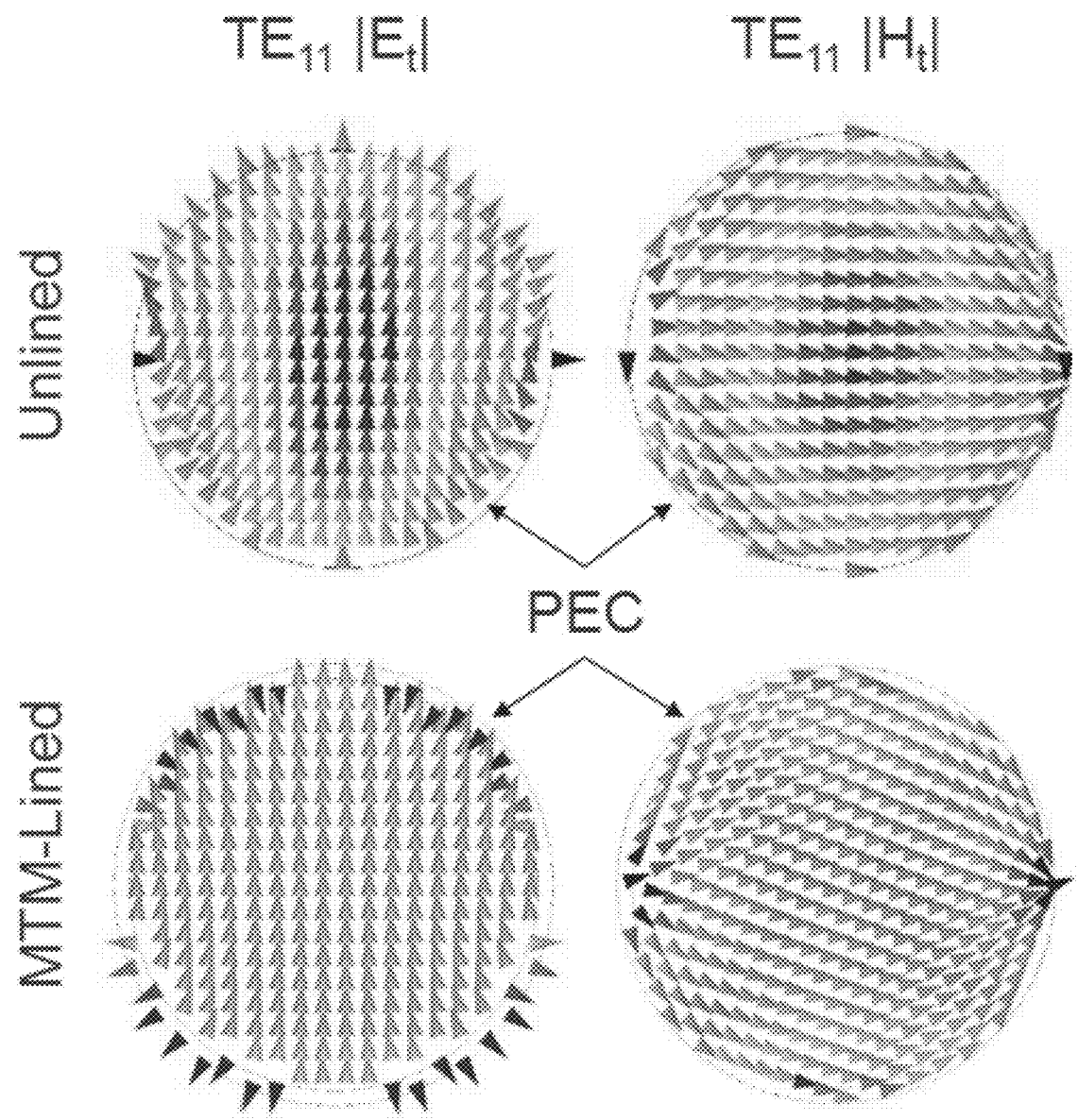
FIG. 3 is a plot of the transverse (i.e., non-axial) vector components of electric and magnetic fields produced in lined and unlined bores at their respective cutoff frequencies.

Transverse components of magnetic and electric fields were plotted as shown in FIG. 3 for a linearly polarized $TE_{11}$ propagating waveguide mode in a circular waveguide bounded by a perfect electric conductor at the respective cutoff frequencies for an unlined bore and a bore lined with an ENNZ metamaterial. The field directions in the transverse plane are represented by arrays of triangles. As expected, the E fields were normal and H fields tangential at the perfect electric conductor. The field magnitude variations were strong in the unlined (vacuum filled) bore and relatively uniform in the metamaterial-lined case. As expected, electric fields in the liner itself were strong.

Simulations have been conducted on a metamaterial lined bore of an MRI scanner at a working frequency of 200 MHz (corresponding to a proton Larmor frequency for an MRI scanner with a magnetic field of 4.7 Tesla). According to the simulations at 200 MHz, the liner offers performance comparable to that of birdcage coils in terms of field homogeneity, sensitivity and SAR, while allowing operation at frequencies beyond those where birdcage coils operate reliably. The frequency of 200 MHz (4.7 T) chosen for this example is beyond the preferred range of suitability of traditional body-sized resonators (≤3 T), and below frequencies at which their performance would suffer greatly (≥7 T), where travelling-wave effects can also become dominant.

In general, higher fields allow greater signal to noise ratio, but high fields result in technical difficulties. The range between 1.5 T and 7 T corresponds to RF (Larmor) frequencies between 64 MHz and 300 MHz. Human-body-size scanners will still be below cutoff in this frequency range, and can therefore benefit from the retrofitting of metamaterial liners to enable travelling-wave excitation. It is believed that the range of 1.5 T to 7 T, and especially 3 T to 7 T is therefore a particularly useful range of field strengths for MRI. 4.7 T could be a particular "sweet spot" for body imaging, low enough to avoid the major challenges of 7 T, but high enough to get better SNR than 3 T. The ENNZ metamaterial liner also allows lower field strengths to be used, including (potentially very) low static $B_0$ filed strengths far below the unlined waveguide cutoff frequency, such as below 0.5 T, while still allowing excitation using a travelling wave. This could be useful to reduce the costs of producing the magnetic field, at the expense of SNR.

Three geometries were simulated in Ansys HFSS, a finite-element-method full-wave electromagnetic simulator:

1. A small hybrid birdcage (12 sections, 41.5 cm long and 36.4 cm in diameter), made resonant at 200 MHz using 46.2 pF end-ring capacitors and 2×50 pF capacitors on each rung, and driven in quadrature using two lumped ports at each end ring.

2. A large hybrid birdcage (16 sections, 42 cm long and 52 cm in diameter), made resonant at 200 MHz using 28.5 pF end-ring capacitors and 2×100 pF capacitors on each rung, and driven in quadrature using four lumped ports at each end ring.

3. The metamaterial liner was 160 cm in length, 2 cm in thickness, and its negative permittivity observes a Drude dispersion attaining values of approximately −0.118 at the frequency of interest (200 MHz).

A driven modal solution was used with discrete, high accuracy sweep, and meshing was adaptive with a maximum segment length of 3 cm. All models included a cylindrical perfect electrical conductor boundary 160 cm in length and 56 cm in diameter. This has an unmodified cutoff frequency of 313.93 MHz. The empty bore is thus below cutoff. For the birdcage coils the ends of the cylinder were also perfect electrical conductor, while for the metamaterial liner they were wave ports (TE mode, circularly polarized), one of which was driven.

For the metamaterial case, conducting hollow cylindrical sections 80 cm in length and 140 cm in diameter, which are above cutoff at 200 MHz, were used between the lined bore and wave ports to illuminate the lined bore using a propagating $TE_{11}$ mode and couple to the lined bore's below-cutoff $HE_{11}$ mode. An anthropomorphic model of an infant 52 cm long (uniform $\varepsilon=76$, $\sigma=0.8$ S/m) was included as a load. A larger body was not used because the large hybrid birdcage was too sensitive to such loads at this frequency. From the simulations, comparisons were made of SAR and B field homogeneity, as well as excitation efficiency and safety efficiency (defined in Table 1).

Figure 4:
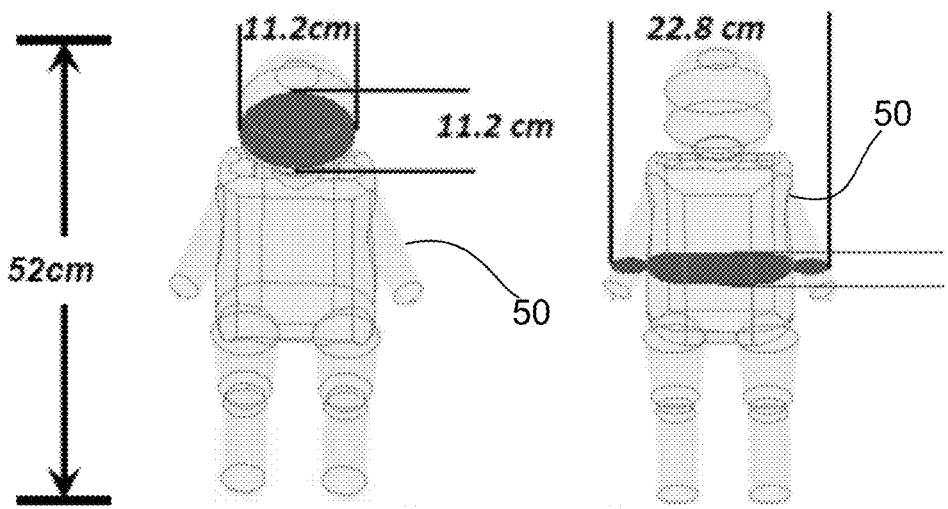
FIG. 4 is a pair of drawings showing an infant model used in a simulation, showing a transverse slice of the head on the left and a transverse slice of a body portion on the right.
Figure 5:
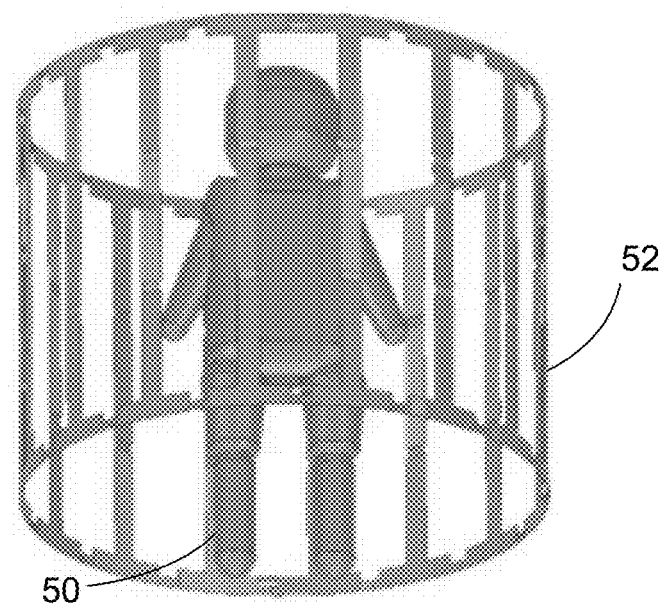
FIG. 5 is an isometric view of the infant model in a large birdcage antenna.

The simulations for each geometry included a simulation of fields with no infant model present, with the infant model present with the head of the infant centrally located with respect to the length of the bore, and a simulation with a body portion of the infant centrally located with respect to the length of the bore. The head was modeled as having a circular cross section 11.2 cm in diameter. The body portion was modeled as having a cross section 22.8 cm across, as measured between two arm portions adjacent to the body, the cross section being 7 cm wide. FIG. 4 shows the head-centered and body centered cross sections of the infant model 50. The cross sections represent the midpoint of the length of the bore in the head-centered and body-centered simulations respectively. FIG. 5 shows the infant model 50 within the simulated large hybrid birdcage 52.

pensive printed circuit board (PCB) techniques and retrofitted into an existing scanner bore.

Our simulations confirm that a metamaterial bore liner could function as a high-field transmit (TX) body coil. While similar to travelling-wave MRI, the liner does not suffer from low sensitivity. When compared to standard birdcage coils the liner offers better or comparable field homogeneity, lower SAR hotspots and higher safety efficiency in the head-centered position. Transmit efficiency is also comparable, while offering 69% more clear space in the bore than the small birdcage.

Thus instead of using birdcage coils, an alternative is to line the bore of the MR system with a metamaterial that can be excited to produce fields that are similar to those produced by traditional body coils. The periodic arrangement of the metamaterial facilitates modular construction using automated PCB techniques and the distributed nature implies an inherent general robustness to manufacturing tolerances.

Figure 6:
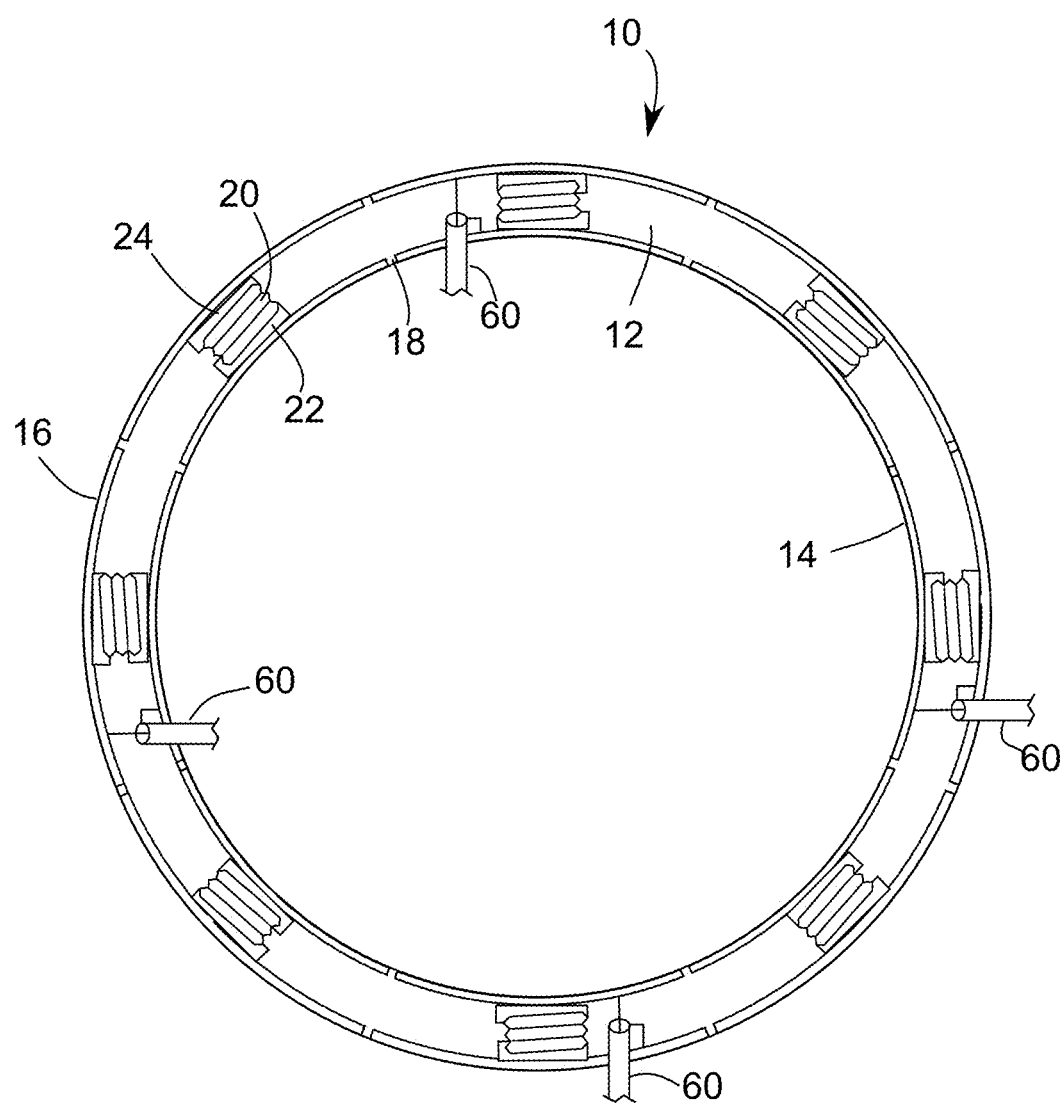
FIG. 6 is a drawing, not to scale, of an annular piece from which a metamaterial lining may be constructed.

As shown in FIG. 6 an example annular metamaterial segment 10 may comprise an annular dielectric substrate 12 supporting an inner circumferential conductor 14, and outer circumferential conductor 16, capacitors 18 on the inner and outer conductors, and inductors 20 connecting the inner and outer conductors. In the embodiment shown, the inner and outer circumferential conductors 14 and 16 may be copper traces on the dielectric substrate. The capacitors 18 may be implemented by gaps in the copper traces, as shown in FIG. 6. Conventional capacitors may also be used. FIG. 6 is not to scale, and of particular note, the widths of the gaps are exaggerated for clarity. The inductors 20 may be conventional inductors, for example from a commercial supplier. In the embodiment shown each inductor 20 has a first terminal 22 connected to the inner conductor 14 and a second terminal 24 connected to the outer conductor 16. The terminals are wires that protrude from the inductors and are

TABLE 1

|  | Head-centered | | | Body-Centered | | |
| --- | --- | --- | --- | --- | --- | --- |
|  | MTM | LBC | SBC | MTM | LBC | SBC |
| Mean field variation (%) | 17 | 17 | 18 | 24 | 23 | 21 |
| Excitation Efficiency $\frac{[B_1^+]}{\sqrt{P_v}}$ [µT/√W] | 0.66 | 0.69 | 0.70 | 0.56 | 0.63 | 0.65 |
| Safety Efficiency $\frac{[B_1^+]}{\sqrt{Max \cdot SAR_{10g}}}$ [µT/√(W/kg)] | 0.54 | 0.51 | 0.51 | 0.40 | 0.48 | 0.55 |
| $SAR_{max}/SAR_{mean}$ | 5.61 | 7.94 | 8.10 | 6.22 | 5.25 | 5.87 |

Field homogeneity achieved by the metamaterial liner is equivalent to that achieved by the birdcage coils both in the empty bore and with a load. The SAR performance is also comparable, with the metamaterial liner outperforming the birdcage coils in the head-centered case (lower SAR hotspots and higher safety efficiency).

While it is a considerable challenge to operate a large birdcage at 200 MHz with the same stability with respect to loading achieved at lower frequencies, the metamaterial liner is robust and can be readily implemented using inexpensive printed circuit board (PCB) techniques and retrofitted into an existing scanner bore.

soldered to portions of the inner and outer conductors shaped to accommodate the terminals.

Optionally, one or more metamaterial segments 10 can be directly connected to sources to produce excitations and could also be connected to detection electronics to detect excitation. Such electrical connections enable the segments 10 to act as antennas. The electrical connections may each comprise a feed network for quadrature drive. FIG. 6 schematically shows electrical connections of feed lines 60 to segments at each end of the liner. An electrically connected segment could also be used to detect excitations produced by a conventional antenna or vice versa.

Electrical connections of sources may be applied in parallel with, or instead of, one or more of the radial inductive loading elements or the azimuthal capacitive gaps of a metamaterial segment, which would generate the appropriate electric-field pattern. Since each of these sources could be driven with different phases, a quadrature drive and other driving scenarios could be realized. The wires delivering the source to a specific inductor or gap could be discreetly integrated with the wires already constituting the metamaterial liner.

For example, the metamaterial segment 10 may be connected via feed lines 60 to a source (not shown) to drive the metamaterial segment 10 so that the metamaterial segment 10 acts as an antenna. In FIG. 6, four coaxial cable feed lines 60 are shown, each one connecting across one of the inductors 20. Different numbers of feed lines may be used. Feed lines could also connect across capacitors 18; which of the inductors or capacitors is connected across may be chosen depending on the impedance seen at the different electronic components. It would also be possible to have some feed lines connecting across inductors and other feed lines connecting across capacitors. Also, a single feed line could connect between any two points in the segment, including across multiple components. In the embodiment shown, the top and bottom feed lines could connect to a first port (not shown) and the right and left feed lines could connect to a second port (not shown). The first and second ports may be driven 90 degrees out of phase of each other, for example using a quad hybrid, to produce circular polarization. Different numbers of ports may be used. Although two ports should be enough, and are typical for birdcage antennas, four ports are common for driving larger structures.

The feed lines in FIG. 6 are schematically shown as leaving the metamaterial segment 10 near where they connect across an electronic component. The feed lines may be run down the scanner bore separately. The feed lines may also follow the metamaterial segment to a particular circumferential location so that the multiple feed lines may exit the bore axially at a collocated circumferential position in the bore. Where the feed lines meet, multiple feed lines associated with the same port may be combined into one. Where the feed lines follow the metamaterial segment, they may be integrated into the metamaterial segment, the integrated feed line portions being configured to attach to an external feed line where the feed line leaves the segment. Integrated feed line portions may comprise coaxial cable but could also use other conductors such as conductive traces on the substrate 12.

Normally, it is not desired to drive more than one or two metamaterial segments using feed lines to act as antennas. Other metamaterial segments thus may have no feed lines. Optionally, other metamaterial segments may be configured to allow feed lines to attach, including if applicable integrated feed line portions, so that driven segments may be interchangeable with non-driven segments. Antennas may also be used instead of driven metamaterial segments. Where such antennas are used, optionally no metamaterial segments may be configures to connect to feed lines 60.

Figure 7:
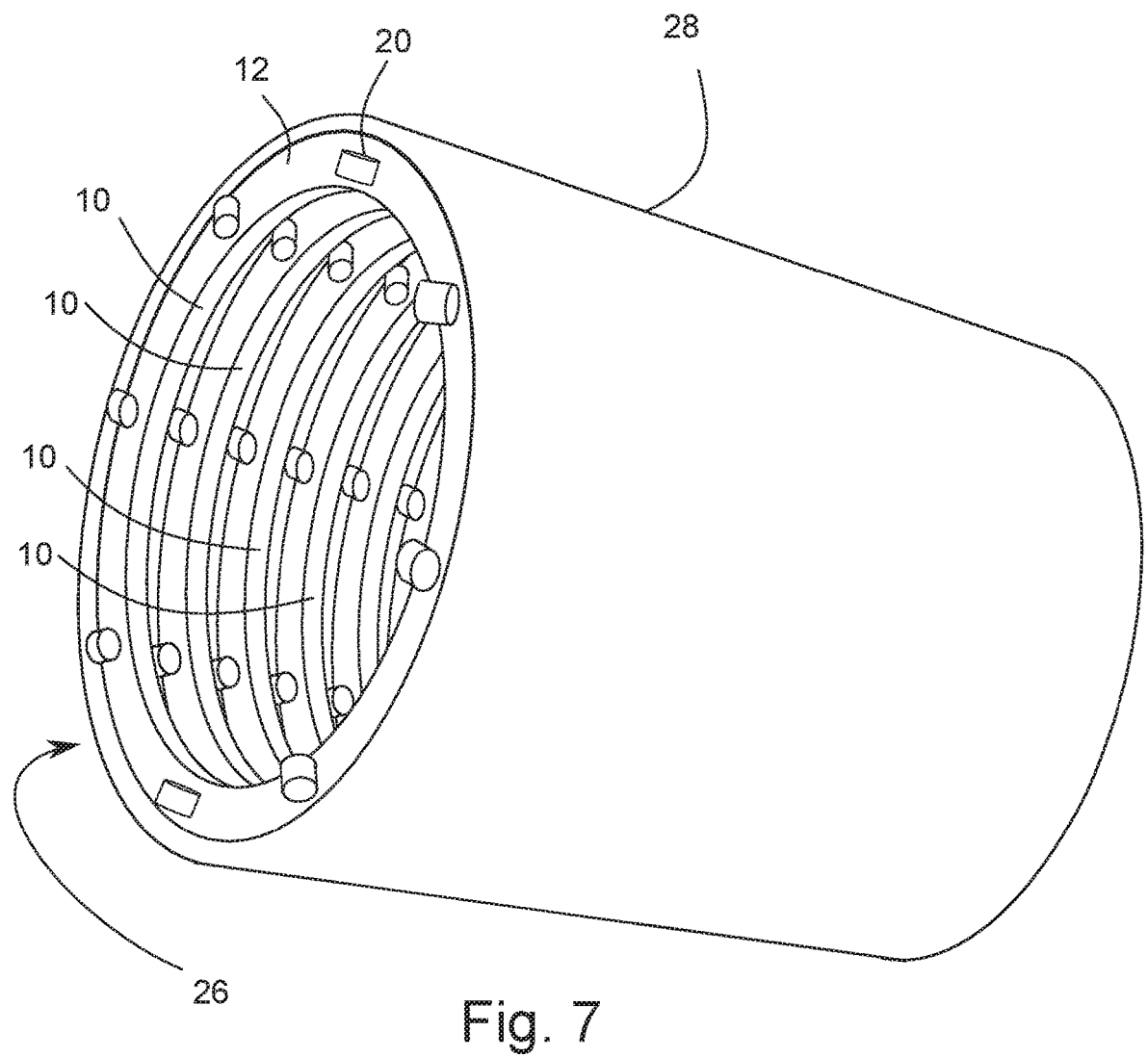
FIG. 7 is a perspective drawing, not to scale, of annular pieces as shown in FIG. 6, but without feed lines, within a bore.

As shown in FIG. 7, a metamaterial liner 26 may be formed, for example, by multiple annular metamaterial segments 10. FIG. 7 is a not-to-scale perspective view of a bore 28 lined with plural annular metamaterial segments 10 forming a metamaterial liner 26. Inductors 20 are represented schematically by cylinders on the substrates 12 and other electromagnetic elements are not shown.

A metamaterial liner 26 similar to that shown in FIG. 7, at approximately 20× smaller scale than a size suitable for an MRI bore, was disclosed in "Experimental Verification of Below-Cutoff Propagation in Miniaturized Circular Waveguides Using Anisotropic ENNZ Metamaterial Liners". As disclosed in that paper, a metamaterial liner was placed in a small bore with a shielded loop antenna adjacent to each end of the metamaterial liner. Measurements were conducted at one antenna of electromagnetic waves originating from the other antenna and propagating through the metamaterial-lined bore. The shielded loop antennas used in this test configuration are King type shielded loop antennas.

The bore in the test configuration disclosed in that paper continued some distance beyond the ends of the metamaterial liner and terminates in a closed end. This enabled more convenient simulation as the simulation could deal with only a finite volume with the perfect conductor as a boundary condition. A standard excitation of a circular waveguide such as this for simulation and testing involves antennas backed by closed conductive ends, typically at a distance of one-quarter of a wavelength at the nominal operating frequency. Otherwise, the simulation domain would need to be terminated in some sort of radiation boundary condition or a perfectly absorbing boundary, which would be less convenient. The wavelength used was such that the electromagnetic waves produced could not propagate significant distances through unlined portions of the bore.

Figure 8:
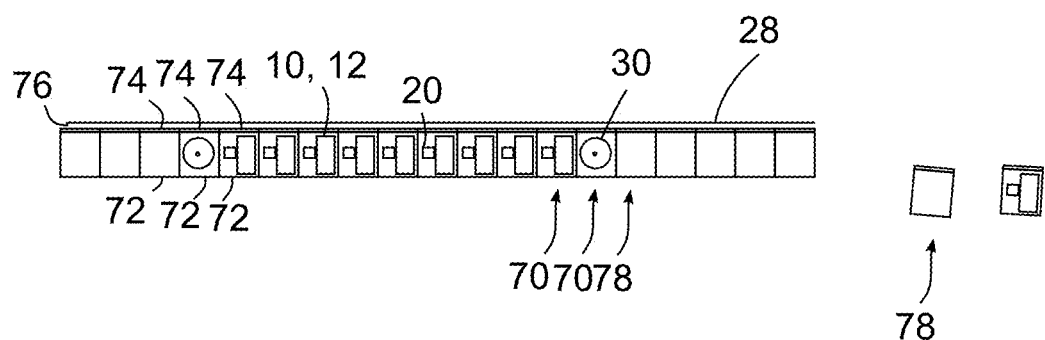
FIG. 8 is a schematic cross section, not to scale, showing a test configuration of a metamaterial as shown in FIG. 6, but without feed lines, within an interior portion of a bore and arranged between two antennas.
Figure 8:
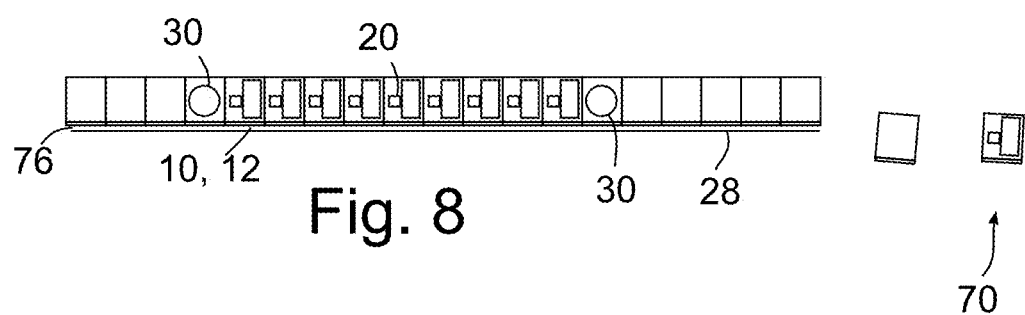

An arrangement of a metamaterial liner between antennas may also be used in an MRI scanner. FIG. 8 is a schematic cross section, not to scale, showing an arrangement of annular metamaterial segments 10 between King-type shielded loop antennas 30. In an example, the liner 26 may be formed of annular segments 10 arranged at regular intervals, each occupying an axial length of the bore. The antennas 30 may for example be positioned at an axial length of the bore at a same regular interval from an end annular segment of the annular segments 10 as adjacent metamaterial annular segments are positioned from each other, so that the antenna occupies a position that an additional metamaterial segment would occupy if it were added to the liner.

In the embodiment shown, each metamaterial segment and antenna is part of a respective removable module 70. The lined length of the MRI bore may be adjusted by removing and replacing annular metamaterial segments, so that where imaging of a small length of the bore is required the lining may be restricted to that length of the bore only to improve SNR. Antennas may also be made movable or removable, and as shown, may themselves be part of removable modules 70. To facilitate removability, the annular metamaterial segments 10 as shown may each be self-contained, with no need for electrical connections to external objects or the bore. The annular metamaterial segments may comprise respective RF-transparent support elements such as respective blocks of polystyrene foam 72 in which the electronic components and substrate 12 are embedded, to ease handling and protect electronic components.

The metamaterial segments may also be made different from one another. This could be useful to adjust the uniformity of the fields in the longitudinal direction.

Running unshielded feed lines to a metamaterial segment or antenna through the interior of the bore from an open end of the bore can create a TEM line supporting a TEM mode, which has no cutoff frequency and will end up propagating across all frequencies. Penetrating the bore 28 is one way to provide shielding, but may make moving an annular segment connected to the wires inconvenient. Also, in an MRI scanner typically the gradient coil sits right outside the bore, further making such penetration of the bore 28 inconvenient.

One option to provide shielding for feed lines, shown in FIG. 8, is to provide an additional bore inside the main scanner bore, for example concentric within the scanner bore. The feed lines can then run outside the additional bore. Where an additional inner bore is used, the inner bore may be made modular. For example, as shown in FIG. 8, each annular metamaterial segment 10, and each antenna 30, may have its own associated length 74 of inner bore radially outside the electronic components of the annular metamaterial segment or antenna, but radially inward of the scanner bore 28. Source wires may connect to a metamaterial segment or antenna by penetrating through the length 74 of inner bore associated with the metamaterial segment or antenna and exiting the scanner axially through a gap 76 between the outer bore 28 and inner bore lengths 74. Where the lined portion of the bore is only a portion of the full length of the bore, additional removable module 78 may be added having no metamaterial or antenna but providing additional lengths of inner bore. These additional modules 78 and the modules 70 may be sized and shaped to be interchangeable. The modules 70 and 78 may be configured to connect together with adjacent modules 70 or 78. Thus, by adding these additional modules 78, the inner bore formed by lengths 74 may be extended as desired to provide additional shielding for the wires, for example for the full length of the scanner bore. This may be combined with shielding the feed lines in other ways such as via a shielded conduit or coaxial cables with grounded sheaths. Such additional shielding may also be made modular, with a length of shielded conduit (not shown) connected to each module 70, or grounding points and supports (not shown) for coaxial cable connected to each module 70. A removed module 70 and removed additional module 78 are shown to the right of the scanner bore 28.

Alternatively or in addition to the additional bore, to reduce excitation of a TEM mode the wires may be made of coaxial cable, and may use a grounded sheath (e.g. grounded to the bore) to reduce radiation. The coaxial cable sheath may be grounded to the bore at regular intervals or continuously. The wires may also, in addition or as an alternative, be shielded in other ways, e.g. by going through a shielded conduit.

The feed lines in an embodiment may be movable so that the metamaterial segment or antenna to which they connect may also be moved. Thus by connecting sources to movable metamaterial segments, the movable segments may act as antennas with adjustable positions. Other antennas may also be connected movably in the same manner. The movable wires may be coaxial cable with sheaths periodically grounded to the bore in a removable manner. The movable wires may, in addition or as an alternative, go through a movable shielded conduit.

The metamaterial segments or modules could also each have one or more notches to support coaxial lines.

Another approach is to supply shielded feed lines running a partial or full length of the scanner bore, with discrete points at which antennas or metamaterial segments can be connected to them. For example, such discrete points may be positioned at spacing corresponding to a spacing of the modules 70. The discrete points may also be positioned less frequently and with movable shielded feed line segments connecting to the discrete points.

Other antenna designs may also be used than the King type shielded loop antennas shown in FIG. 8, including metamaterial segments that are connected to feed lines, as shown in FIG. 6. The shielded loop antennas shown in FIG. 8 produce linearly polarized excitations. It is believed that these antennas may be adapted for multi-port excitation, e.g. using two linearly polarized ports with a phase shift created externally, to realize circular polarization. A 1-port antenna could also be designed that would create circular polarization. Standard excitation methods such as stubs should also work, as the metamaterial lined bore when excited has strong E fields to couple to. Coupling stubs are short posts that are connected on one end to a coaxial cable and the other end protrudes (radially) into the waveguide. Similarly you can bend the stub and connect it to the waveguide wall to obtain a coupling loop.

Separate antennas could be used for transmit and receive, or a single antenna could be used for both, e.g. using a circulator. A transmit antenna as described above could also be used with a conventional receive antenna.

The simulation above using waveports should be applicable to excitations using an antenna, as the waveport excitation is essentially a boundary condition on the simulation domain that assumes a field distribution corresponding to certain propagating modes. The boundary condition will faithfully mimic a real excitation (e.g. an antenna) that is known to produce the same fields.

Where the metamaterial lining covers only a portion of the length of the bore, this allows improved SNR as compared to conventional traveling wave MRI, due to the waves only propagating through the lined portion of the bore. It is believed that the lower image quality of conventional travelling wave MRI results at least in part from the travelling wave passing through the entire length of the bore rather than through a more localized part of the bore, reducing signal to noise ratio for any particular part.

The lined portion of the bore may extend through an intermediate portion of the bore between two ends of the bore and not extend to either of the two ends. As the waves reflect off the unlined portion of the bore, this leads to standing waves within the lined portion. Where the lined portion extends to one or both ends of the bore, the waves will also reflect off the end of the bore, along with radiating from the end. In either case of reflecting off an unlined portion or reflecting off an end of the bore the standing waves are not "pure" because the evanescent fields permitted outside the lined region, or the radiation pattern from an open end, provide a boundary condition causing the mode to reflect which is not a hard boundary condition. In fact, our simulations using the annular metamaterial segments show that the fields are still very homogeneous across the length of the lined bore. The fields die down as they leave the lined portion of the bore.

As described above and shown in FIG. 8, antennas 30 located at the inner diameter of the bore adjacent to the metamaterial liner 26 may be used to produce and/or detect excitations for MRI. The antennas produce the excitations at a working frequency of the MRI scanner which is typically the Larmor frequency for protons at the magnetic field strength in the bore. In order to keep the antenna from reducing the available cross section of the liner, the antenna may be for example loop shaped and positioned within a range of radial positions with respect to the bore that is also occupied by the liner, so that the antenna does not further reduce the available cross section of the bore. As shown, it can be in a module 70 that is sized and shaped to be interchangeable with other modules containing metamaterial liner segments. The statement that modules are sized and shaped to be interchangeable means that the modules can be physically moved to swap positions, and does not mean that they have the same size and shape in dimensions that are inessential to this swap of positions, e.g. interior diameter.

Larger antennas may also be used and may still reduce claustrophobia relative to a birdcage coil. For an MRI with a working frequency below a cutoff frequency of the unlined bore, which is the case for typical MRI scanners, the antennas may be positioned close enough to the metamaterial liner that the liner that the bore at the position of the antenna has a passband including the working frequency. The antenna may also be positioned more distantly from the liner, so long as the evanescent waves of the antenna substantially reach the liner to energize the liner with good efficiency. Proximity to the liner also helps smooth out the response of the excitations to the input from the antenna. The antennas could also be placed radially inward of the metamaterial segments or between annular metamaterial segments.

One can also have an adjustable length of lined bore with a fixed antenna, by having an antenna at one end of the lined length of the bore and adjusting the other end of the lined length of the bore, for example using modules 70 as described above. Feed lines may be connected to the antenna fixedly with fixed shielding. In an embodiment, the lined length of the bore may extend to the end of the bore at the end with the antenna, and the antenna may be positioned outside of the bore, alleviating the shielding requirements for the feed lines.

While conventional MRI uses surface coils within the bore to detect NMR signals, routing cables to surface coils in the bore in travelling wave MRI can change the propagation characteristics of the bore by introducing TEM modes. To deal with this, the cables can be shielded in any of the same ways as described above for feed lines, or where the lined portion extends to an end of the bore, an antenna may be placed at the end of the bore.

In the claims, the word "comprising" is used in its inclusive sense and does not exclude other elements being present. The indefinite articles "a" and "an" before a claim feature do not exclude more than one of the feature being present. Each one of the individual features described here may be used in one or more embodiments and is not, by virtue only of being described here, to be construed as essential to all embodiments as defined by the claims.

The embodiment of the invention in which an exclusive property or privilege is claimed are defined as follows:

1. A liner for a bore of an MRI scanner, the liner installed in the bore and being formed of a metamaterial located adjacent to an internal surface of the bore and comprising unit cells having circumferential extent within the bore, the liner extending less than a full length of the bore.

2. The liner of claim 1 in which the metamaterial comprises plural annular metamaterial segments.

3. The liner of claim 2 in which each annular metamaterial segment has an inner circumferential conductor and an outer circumferential conductor, capacitors on at least one of the inner and outer conductors, and inductors connecting the inner and outer conductors.

4. The liner of claim 2 in which each annular metamaterial segment is configured to be removable from the bore.

5. The liner of claim 1 in which nuclear spins in the bore of the MRI scanner are electromagnetically excited by an antenna located adjacent to the bore.

6. The liner of claim 1 in which nuclear spins in the bore of the MRI scanner are electromagnetically excited by an antenna located within the bore adjacent to the liner.

7. The liner of claim 2 in which a metamaterial segment is electrically connected to a power source to electromagnetically excite nuclear spins in the bore of the MRI scanner.

8. The liner of claim 1 in which when installed in the MRI scanner the liner extends through an intermediate portion of the bore between two ends of the bore and does not extend to either of the two ends.

9. The liner of claim 1 in which the static magnetic field of the MRI scanner has a strength of greater than 1.5 Tesla and less than 7 Tesla.

10. The liner of claim 2 in which each annular metamaterial segment is part of a metamaterial module, the respective metamaterial modules being sized and shaped to be interchangeable.

11. The liner of claim 10 in which the metamaterial modules are configured to connect to adjacent metamaterial modules.

12. The liner of claim 10 in which each metamaterial module comprises an additional bore segment, the additional bore segments forming an additional bore within the scanner bore when the modules are in place within the bore.

13. The liner of claim 12 in which additional modules sized and shaped to be interchangeable with the metamaterial modules are placed within the bore to provide further additional bore segments to cause the additional bore to extend the full length of the scanner bore.

14. The liner of claim 1 in which electromagnetic excitations are produced at the working frequency by an antenna located within the bore adjacent to the liner and connected to a feed line.

15. The liner of claim 10 in which electromagnetic excitations are produced at the working frequency by an antenna located within the bore adjacent to the liner and connected to a feed line and the antenna is in an antenna module, the antenna module being sized and shaped to be interchangeable with the metamaterial modules.

16. The liner of claim 12 in which electromagnetic excitations are produced at the working frequency by a metamaterial segment connected to a feed line and the feed line extends through a gap between the additional bore and the scanner bore.

17. The liner of claim 14 in which the feed line comprises coaxial cable having a sheath grounded to the bore.

18. The liner of claim 1 having a relative electrical permittivity that is negative and near zero at a working frequency of the MRI scanner corresponding to a Larmor frequency in a magnetic field of the MRI scanner.

19. A method of magnetic resonance imaging, the method comprising:
    supplying an MRI scanner having a scanner bore;
    positioning a first number of annular metamaterial segments within the bore, to form a metamaterial liner extending a first length within the scanner bore and having a relative electrical permittivity that is negative and near zero at a working frequency of the MRI scanner corresponding to a Larmor frequency in the magnetic field of the MRI scanner;
    producing first excitations within the first length of the scanner bore;
    detecting first NMR signals resulting from the first excitations within the first length of the scanner bore to produce a first image;
    removing one or more of the annular metamaterial segments from the scanner bore to reduce the metamaterial liner to a second length within the scanner bore smaller than the first length;

producing second excitations within the second length of the scanner bore; and detecting second NMR signals resulting from the second excitations within the second length of the bore to produce a second image.

20. A liner for a bore of an MRI scanner, the liner installed into the bore and having a relative electrical permittivity that is negative and near zero at a working frequency of the MRI scanner corresponding to a Larmor frequency in the magnetic field of the MRI scanner and being formed of a metamaterial comprising unit cells having circumferential extent within the bore, the liner extending less than a full length of the bore.

21. The liner of claim 20 in which the metamaterial comprises plural annular metamaterial segments.

22. The liner of claim 21 in which each annular metamaterial segment has an inner circumferential conductor and an outer circumferential conductor, capacitors on at least one of the inner and outer conductors, and inductors connecting the inner and outer conductors.

23. The liner of claim 21 in which each annular metamaterial segment is configured to be removable from the bore.

\* \* \* \* \*